United States Patent
Chenakin (10) Patent No.: US 9,843,086 B1
(45) Date of Patent: Dec. 12, 2017

(54) YIG-BASED CLOSED LOOP SIGNAL FILTERING AND AMPLITUDE CONTROL

(71) Applicant: MICRO LAMBDA WIRELESS, INC., Fremont, CA (US)

(72) Inventor: Oleksandr Chenakin, Morgan Hill, CA (US)

(73) Assignee: Micro Lambda Wireless, Inc., Fremont, CA (US)

( * ) Notice: Subject to any disclaimer, the term of this patent is extended or adjusted under 35 U.S.C. 154(b) by 0 days.

(21) Appl. No.: 15/445,629

(22) Filed: Feb. 28, 2017

(51) Int. Cl.
*H03B 5/30* (2006.01)
*H01P 7/00* (2006.01)
*H03B 5/10* (2006.01)
*H03B 5/18* (2006.01)

(52) U.S. Cl.
CPC ............. *H01P 7/00* (2013.01); *H03B 5/10* (2013.01); *H03B 5/1847* (2013.01); *H03B 5/1852* (2013.01); *H03B 5/30* (2013.01)

(58) Field of Classification Search
CPC .......... H03B 5/1852; H03B 5/30; H03B 5/10; H03B 5/1847
USPC ............. 708/807; 327/113, 347; 331/117 D, 331/108 D, 96, 154, 175
See application file for complete search history.

(56) References Cited

U.S. PATENT DOCUMENTS

| | | | |
|---|---|---|---|
| 3,740,675 A | 6/1973 | Moore et al. | |
| 3,783,509 A * | 1/1974 | Lake | B26B 1/042 30/161 |
| 4,965,539 A | 10/1990 | Korber, Jr. | |
| 5,801,591 A * | 9/1998 | Parrott | H03B 5/1888 331/117 D |

OTHER PUBLICATIONS

Carter, Magnetically Tunable Microwave Filters Using Single-Crystal Yttrium-Iron-Garnet Resonators, in IEEE Transactions on Microwave Theory and Techniques, vol. MTT-9, 1961, pp. 252-260, entire document.

J. D. Adam, L. Davis, G. Dionne, E. Schloemann and S. Stitzer, "Ferrite Devices and Materials," in IEEE Transactions on Microwave Theory and Techniques, vol. MTT-50, 2002, pp. 721-737, entire document.

D. Harris, "A 4-40 GHz Wide Bandwidth, Magnetically Tuned Bandpass Filter;" in IEEE International Microwave Symposium Dig., 1990, pp. 1019-1022, entire document.

* cited by examiner

*Primary Examiner* — Arnold Kinkead
(74) *Attorney, Agent, or Firm* — Stephen E. Zweig (57) ABSTRACT

An apparatus and method for building and operating of a YIG-based filter-attenuator module with closed-loop control. The module combines both signal filtering and amplitude control functions by utilizing an yttrium-iron-garnet (YIG) resonator. A technique for a closed-loop calibration and control also disclosed. This apparatus and method provides a cost effective harmonic rejection/amplitude control solution for microwave test-and-measurement instruments such as signal generators and spectrum analyzers.

19 Claims, 6 Drawing Sheets

Fig. 1

Prior art

Fig. 2

Prior art

Fig. 3

Prior art

YIG-BASED CLOSED LOOP SIGNAL FILTERING AND AMPLITUDE CONTROL

BACKGROUND OF THE INVENTION

Field of the Invention

The invention relates to devices and methods for signal filtering and amplitude control. More particularly, it relates to ferrite resonator, such as yttrium-iron-garnet (YIG) resonator, based signal filtering and amplitude control methods.

Description of the Related Art

YIG-resonator based microwave filters, often formed from a single small sphere of Yttrium Iron Garnet material, are widely used in the microwave field. Such filters are described by the work of Moore, U.S. Pat. No. 3,740,675, Korber, U.S. Pat. No. 4,965,539, and others.

See also: Carter, *Magnetically Tunable Microwave Filters Using Single-Crystal Yttrium-Iron-Garnet Resonators,* " in IEEE Transactions on Microwave Theory and Techniques, vol. MTT-9, 1961, pp. 252-260; J. D. Adam, L. Davis, G. Dionne, E. Schloemann and S. Stitzer, "Ferrite Devices and Materials," in IEEE Transactions on Microwave Theory and Techniques, vol. MTT-50, 2002, pp. 721-737; and D. Harris, "A 4-40 GHz Wide Bandwidth, Magnetically Tuned Bandpass Filter;" in IEEE International Microwave Symposium Dig., 1990, pp. 1019-1022.

YIG resonator based filter devices have several advantages, specifically high operating frequency and wide tuning range, and are widely used in microwave test-and-measurement instruments such as signal generators and spectrum analyzers.

Figure 1:
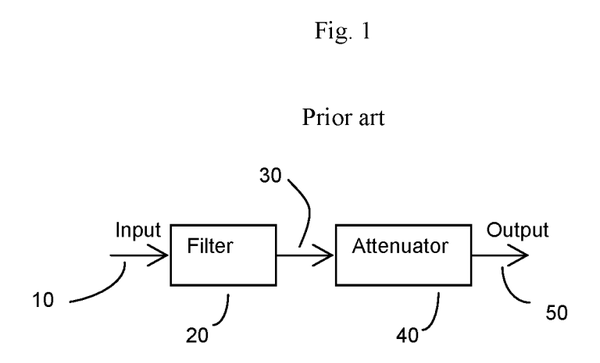
FIG. 1 shows a simplified block diagram of a conventional (prior art) signal generator output module that includes both a separate filter for harmonic filtering and a separate attenuator for signal level control.

In addition, these instruments often also use one or more separate electromechanical or electronic attenuator devices for signal level control, as is depicted in FIG. 1. Such attenuators are typically used to adjust the output voltage of these microwave test-and-measurement instruments to a desired range. For example, an input microwave signal (10) spanning a plurality of microwave frequencies may be input into a YIG resonator based filter device (20), which will typically only pass a limited subset of the input frequencies. The output (30) from the YIG resonator based filter device is then adjusted to a desired output power range (often measured as a voltage range) by feeding the output into a separate attenuator device (40), thus producing an attenuated output (50) microwave signal covering the filtered range of frequencies, with a maximum power (and hence voltage) level controlled by the setting of separate attenuator device (40).

Electromechanical attenuator devices are often used for these applications (e.g. 40) because they can provide a very low insertion loss and a wide amplitude control range. However due to their mechanical operation principles, the switching speed and life time of such electromechanical attenuator devices can be limited. Alternatively, certain types of solid state attenuators can also be used, but these have other drawbacks, which will be discussed shortly.

Figure 2:
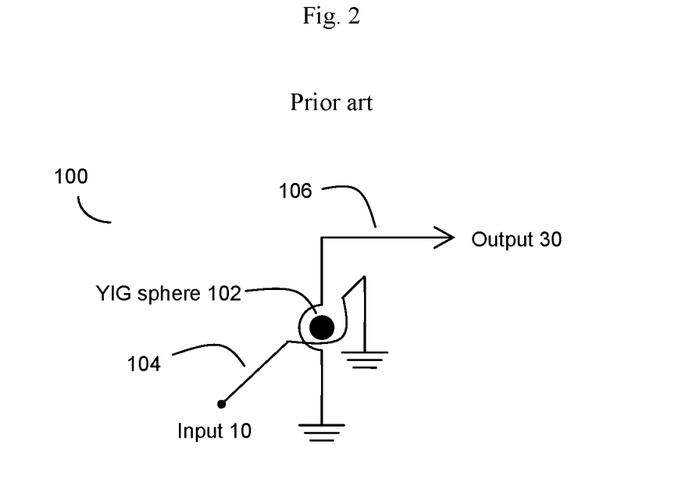
FIG. 2 shows a simplified block diagram of a conventional (prior art) YIG filter, comprising a YIG sphere, a YIG input loop or wire, and a YIG output loop or wire.

A simplified block diagram of a conventional (prior art) YIG filter (100) is shown in FIG. 2.

Figure 3:
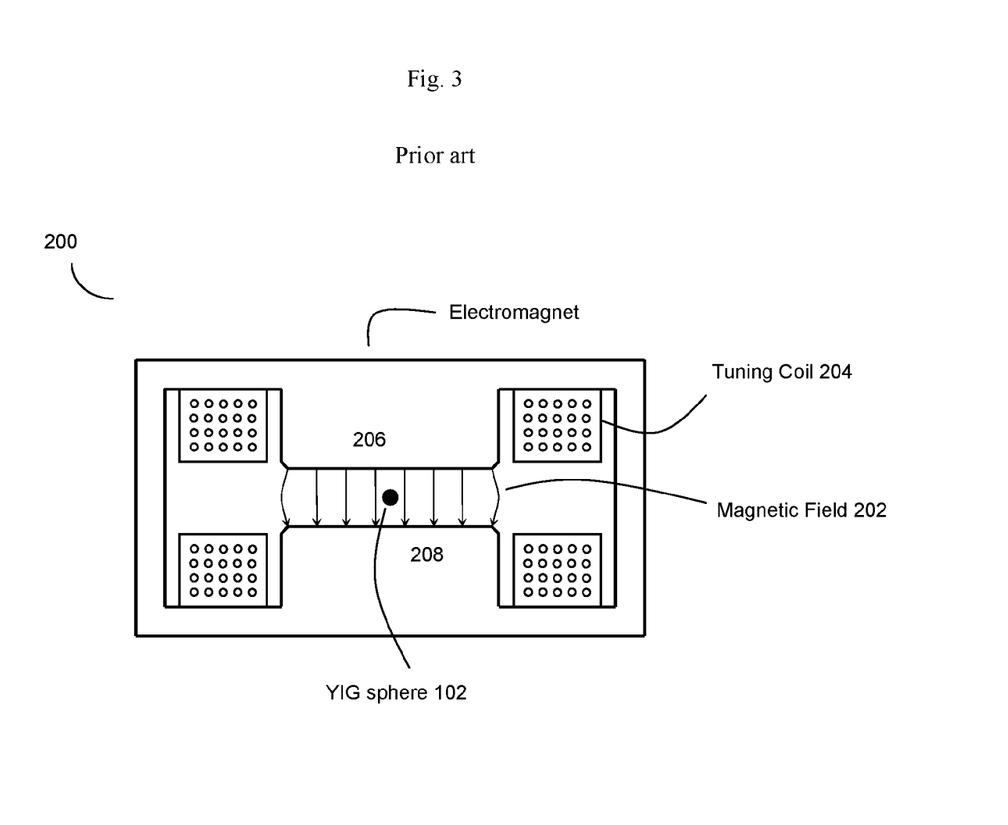
FIG. 3 shows a simplified cross-sectional view of an exemplary magnetic structure of a conventional (prior art) YIG filter.

A typical YIG filter often comprises a high-Q spherical YIG resonator element (102) (e.g. a YIG sphere), that is held in a magnetic field (see FIG. 3).

Typically a piece of wire (104), often called an input coupling loop, but here referred to as an input coupling wire, is partially wound around the YIG sphere (102) (often about half of the YIG sphere), and is positioned so that the coupling wire (104) can magnetically couple to the YIG sphere (resonator). Another piece of wire (106), often called an output coupling loop, but here referred to as an output coupling wire, is also partially wound around the YIG sphere, and also magnetically couples to the YIG sphere (resonator) (102). The input signal (10) is then magnetically coupled to the output signal (30) via the magnetic coupling between these two wires and the YIG sphere, and this coupling varies according to the resonant frequency of the YIG sphere (resonator) (102).

One or more YIG filters may be optionally combined, and configured to produce either bandpass filters or notch (e.g. bandreject) filters.

A simplified cross-sectional view (200) of an exemplary magnetic structure of a conventional (prior art) YIG filter is shown in FIG. 3. The magnetic field (202) is typically provided, at least in part, by an electromagnetic coil (204) (such as an electromagnetic tuning coil). This adjusts the strength of the magnetic field surrounding the YIG sphere, and hence the resonant frequency of YIG sphere, and hence can be used to tune the frequency of the YIG filter.

In some embodiments, the strength of the magnetic field can be further enhanced by use of a larger electromagnet and/or permanent magnet (not shown). The spherical YIG resonator (102) and the wires (not shown) are placed between the poles (206, 208) of this electromagnet. Frequency tuning can be provided by changing the magnetic field (202), with fine tuning often provided using a variable DC current flowing through the electromagnet tuning coil (204).

As discussed above, the frequency of a YIG resonator can be adjusted by varying the intensity of the YIG sphere's (YIG resonator's) magnetic field (202). This tuning is possible since the resonant frequency of the isotropic YIG resonator (102) in a uniform magnetic field is a nearly linear function of the magnetic field strength. The basic relationship between the YIG resonator resonant frequency $f$ and magnetic field strength H is given as follows:

$$f = \gamma H, \text{ where: } \gamma = 2.8 \text{ MHz/Oe is the gyromagnetic ratio.}$$

The gyromagnetic ratio is a physical constant, which is independent of the YIG resonator size.

Unfortunately, YIG resonator frequency is not perfectly stable. It is often temperature dependent, in part because the dimensions of the magnets used to create the magnetic field, and thus the magnetic field strength, can vary somewhat with temperature. To compensate, in prior art YIG resonator based filters, the YIG spheres are often heated above ambient temperature, and then temperature controlled using various temperature control methods.

BRIEF SUMMARY OF THE INVENTION

The invention is based, in part, on the insight that alternative methods of stabilizing the operating frequency of YIG resonators, and hence the frequency filtering stability of YIG filters, would be desirable.

The invention is also based, in part, on the insight that alternative methods of controlling output signal levels, such as alternatives to prior art electromechanical attenuators, would also be desirable. This is because although electromechanical attenuators provide very low insertion loss and wide amplitude control range, their switching speed and life time can be limited due to their mechanical operation principles.

Although faster and more reliable prior art electronic solid-state attenuators are available, they tend to suffer from a higher signal insertion loss and smaller signal attenuation range.

Another problem with both prior art YIG filters and mechanical/solid state attenuators is that they need calibrating and frequency adjusting to keep the signal level constant with frequency change. Another problem with the prior art devices is that because these prior art filtering and attenuation functions have traditionally been carried by two separate devices (e.g. a separate filter and a separate attenuator), this can result in higher signal insertion loss and also higher manufacturing costs.

The invention is also based, in part, on the insight it would be desirable to have a YIG based device and method that can, at the same time and with the same YIG resonator, provide both filtering and signal attenuating functionality.

As will be discussed, according to the invention, such a combined YIG filter and signal attenuation device and module is taught that can improve upon the prior art with lower signal insertion losses, more reliable control mechanisms, and lower manufacturing costs.

In some embodiments, the invention may be a system and device as well as a closed-loop control method of operating a novel type of YIG resonator based combination filter and attenuator device. This system and device uses a YIG resonator positioned in an electromagnetic coil voltage controlled magnetic field such that a YIG resonant frequency of said YIG resonator is tuned by said electromagnetic coil voltage.

According to the invention, the YIG resonator is magnetically coupled to both an input coupling wire and an output coupling wire so that the input coupling wire uses the YIG resonator to transfer input signals (e.g. microwave frequency RF input signals) to the output coupling wire, thus producing output signals. Here, the efficiency of coupling varies according to a resonator frequency response curve (see FIG. 4 402) that has the least amount of insertion loss (e.g. minimal attenuation) at the peak of the response curve (404), when the YIG resonant frequency of the YIG resonator is tuned to an input frequency of the microwave frequency RF input signals.

Figure 4:
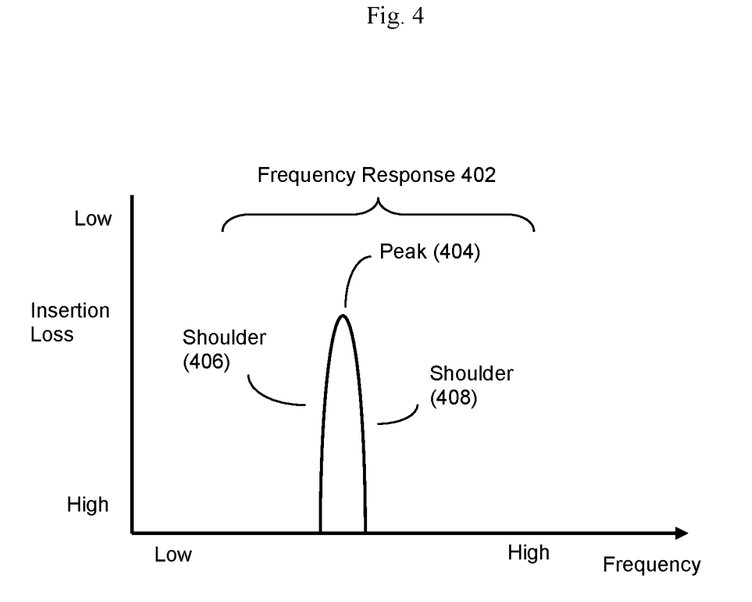
FIG. 4 shows a frequency response (insertion loss vs. operating frequency) of a YIG filter.

According to the invention, the YIG resonator is operated in a detuned mode so that the RF input frequency falls on a shoulder of the response curve (406 or 408), rather than on a peak (404) of the response curve. Because of this detuned mode, the YIG resonator produces an attenuated output signal where changes in the YIG resonance frequency alter the amount of attenuation of this attenuated output signal.

The invention operates by detecting this amount of attenuation (often by detecting and measuring a DC voltage that corresponds to the power of the RF signal output by the combination filter/attenuator device), and by comparing this amount of attenuation versus a reference (e.g. a reference signal, such as a reference voltage, that indicates the desired amount of attenuation).

The invention then uses differences between the observed amount of attenuation, and the reference, to control the strength of the magnetic field generated by the electromagnetic coil (often by varying the coil voltage), and hence control the frequency response curve (402) and the shape of the curve's shoulder regions (406 or 408), which in turn impacts the amount of attenuation. The invention thus produces a closed loop control system, where minor deviations in attenuation, relative to the reference, show up as changes in the magnetic field surrounding the YIG resonator. This alters the system's frequency response curve, as discussed above, in a manner that corrects for these deviations in attenuation.

DETAILED DESCRIPTION OF THE INVENTION

As will be discussed shortly, in some embodiments, the invention may comprise a combination YIG-based, closed-loop signal filtering (filter) and amplitude control (e.g. attenuator) device and method.

Note that YIG filters can be configured as either bandpass filters or notch filters. In this disclosure, we will use bandpass filters for the various specific examples, but these examples are not intended to be limiting.

In some embodiments, the invention's combined filter and attenuator device and method can be implemented either as a new method of controlling prior art YIG resonator based filter devices, and/or as a new type of YIG resonator based filter device, as well as a new method of controlling this new type of YIG resonator based filter device. In either case, the invention will typically utilize the closed loop control methods described in more detail in FIG. 5A and FIG. 5B.

In these embodiments, the invention can comprise a closed-loop control method of operating a YIG resonator device. This method can comprise obtaining a YIG resonator (e.g. a YIG sphere 102) positioned in an electromagnetic coil voltage controlled magnetic field (202) such that a YIG resonant frequency (402) of said YIG resonator is tuned by the electromagnetic coil (e.g. tuning coil 204) voltage.

Figure 5A:
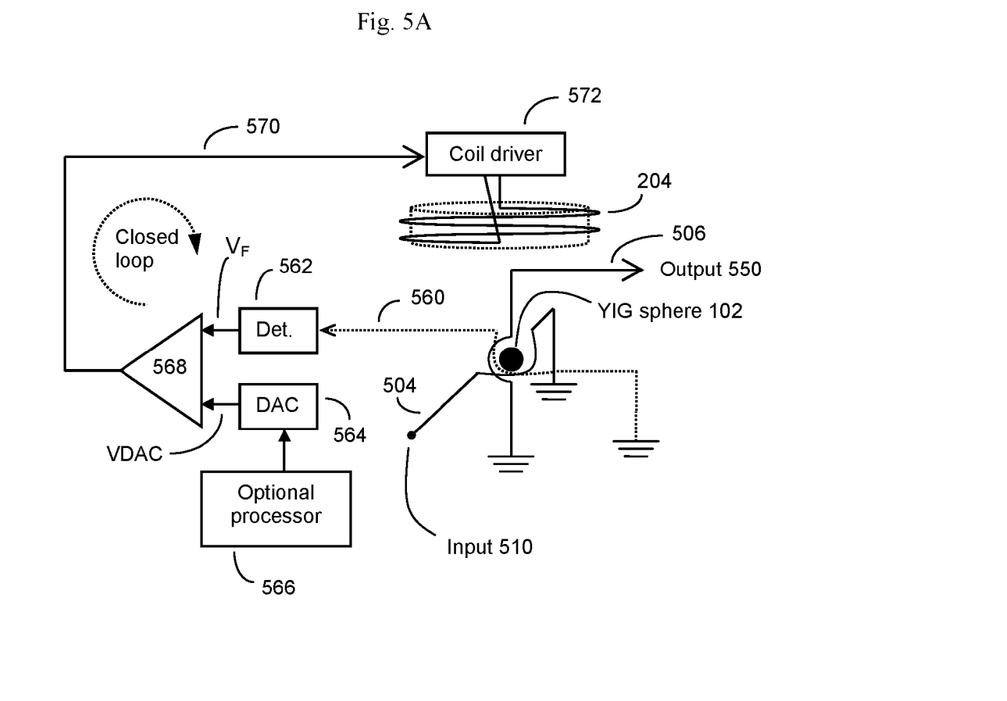
FIG. 5A shows a simplified block diagram of the invention.

In this embodiment, the YIG resonator is magnetically coupled to both an input coupling wire (104 or 504) and an output coupling wire (106 or 506) such that the input coupling wire uses the YIG resonator (e.g. resonating YIG sphere 102) to transfer RF input signals (e.g. 10, 510) to the output coupling wire (106, 506), thus producing output signals (50, 550). Note that in contrast to prior art, these are (controlled) attenuated output signals (50, 550), rather than (non-controlled) unattenuated output signals (30). That is, although prior art YIG filters of course had a small amount of attenuation, this attenuation could not be controlled without the use of separate attenuator devices. This is why these prior art devices are considered to be lacking separate (adjustable) attenuators.

Although, like prior art YIG resonator based filters, the invention also operates according to a response curve that has the lowest amount of attenuation (e.g. lowest insertion loss) when the YIG resonant frequency of the YIG resonator is tuned to an input frequency of said input signals (e.g. peak 404), here there is an important difference. One difference is that the invention operates the YIG resonator in a detuned mode so that the input frequency (10, 510) falls on a shoulder (see FIG. 4, 406 or 408) of the response curve, rather on the peak of the response curve (404), thus producing an attenuated output signal where changes in YIG resonance frequency alter an amount of attenuation of the attenuated output signal (50, 550).

As will be discussed, the invention detects this amount of attenuation. This can be done by either sampling the power of the output signal (106, 506) via a microwave coupling mechanism, or via a third sensing wire. In either event, the power of the output signals is converted to a DC voltage that corresponds to the detected output signal). The invention then compares this amount of attenuation versus a reference (e.g. an ideal attenuation standard, such as an ideal DC reference voltage). The invention then uses differences between the detected amount of attenuation, and reference (e.g. ideal attenuation) to control the electromagnetic coil voltage (204). This in turn moves the frequency response curve (402) upwards and downwards with respect to frequency, which is further shown as FIG. 5B. (580 and 590).

More specifically, in some embodiments, the invention can thus be a new method of controlling a prior art YIG resonator based filter device (see FIG. 2) placed between electromagnet poles as shown in FIG. 3.

Figure 5B:
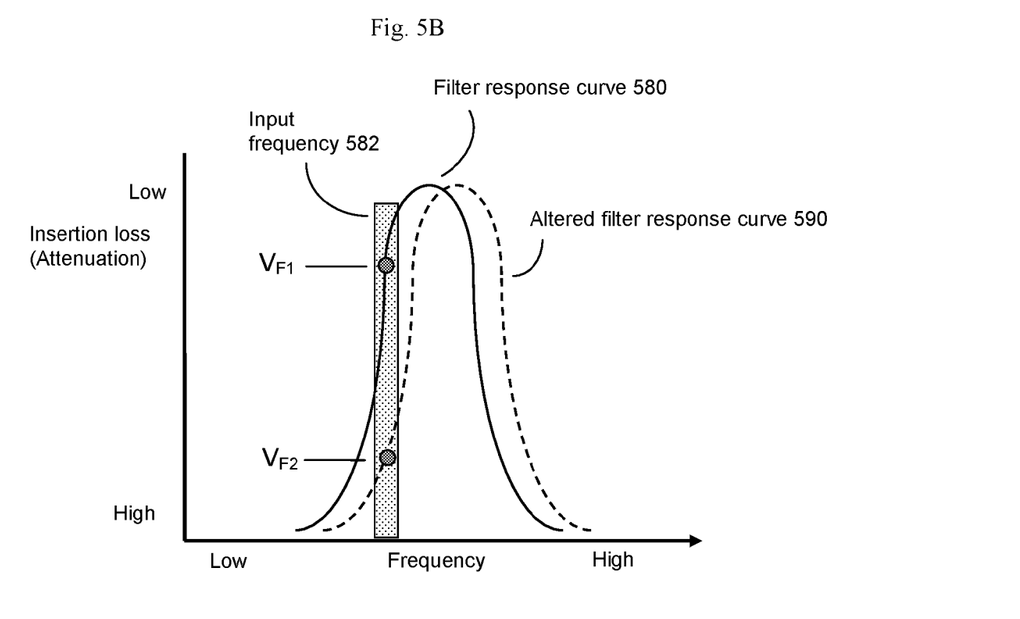
FIG. 5B shows how the invention achieves a closed loop control scheme by altering the frequency response of the YIG resonator, thus regulating the amount of attenuation around a desired attenuation reference.

In other embodiments, as shown in FIGS. 5A and 5B, and as previously discussed, the invention may be both a new type of combination YIG resonator based filter device, as well as a new method of controlling this new type of YIG resonator based filter device.

In some embodiments, the invention's YIG resonator based filter may also be connected to input terminals (10) with a coupling wire loop (104), as was previously shown in FIG. 1 and FIG. 2. However in contrast to prior art approaches, because the invention is a combination filter and attenuator, the invention effectively converts what would have previously been an unattenuated output (30) via wire loop (106) into an attenuated output (50) as shown in FIG. 1.

Here, like prior art YIG resonator based filters, the invention's YIG resonator provides strong coupling between the input and output loops at its resonant frequency given by:

$$f=\gamma H,$$

where H is the magnetic field strength and is the gyromagnetic ratio. The gyromagnetic ratio is a physical constant, which is independent of the YIG resonator size.

This is how this structure forms a microwave RF filter with a frequency response as shown in FIG. 4.

The resonant frequency can be changed in wide limits by changing the strength of the magnetic field (see FIG. 2, 202). This is often done by varying a DC current flowing through the electromagnet tuning coil (204).

One problem of prior art YIG resonator based filters is frequency drift due to magnetic field strength instabilities. These are greatly impacted by temperature, which can cause mechanical instabilities, such as a change in the air gap between the poles (206, 208) of the YIG sphere's surrounding electromagnet (200). As a result, the YIG resonant frequency can move with temperature change, and this produces a typically undesired and unstable change in the output (30) RF signal level, as well as undesired instabilities in the YIG filter frequency range.

This invention helps to mitigate these instability problems by operating the filter in its skirt or shoulder (406, 408), relative to the RF input frequency (10, 510). That is, the system is typically operated in a detuned mode where the incoming signal frequency is located on the shoulder (406 or 408) of the filter's frequency response curve, rather than in the main or peak part (404) of the filter's frequency response curve). As previously discussed, among other features the invention also helps to mitigate these instability problems by utilizing closed-loop frequency control methods, as shown in FIG. 5A and FIG. 5B.

Thus in some embodiments, the invention is also a system or method to stabilize a YIG resonant frequency of a YIG resonator. This method uses differences between the amount of attenuation and reference to control the electromagnetic coil voltage (204) so that the amount of attenuation is controlled with respect to fluctuations in the YIG resonant frequency. Here, of course, the method will operate best when the input (10, 510) frequency is substantially constant.

Note that by operating on the shoulder of the filter's frequency response curve (either 406 or 408), in some embodiments, the invention can be used to operate the YIG resonator device as a signal attenuator. Here, as discussed previously, and as will be discussed shortly in more detail, the invention operates by further adjusting the reference (e.g. a reference voltage representing the desired amount of attenuation) to control the electromagnetic coil (204) voltage. This moves the frequency response curve (FIG. 4, 402) up and down the frequency axis (see FIG. 5B, 580, 590), and as a result tunes the shoulder (either 406 or 408) of the response curve (402) with respect to the input frequency (see FIG. 5B and discussion for more detail). This produces an attenuated output signal with a desired amount of attenuation. That is, the amount of attenuation can be controlled by the system.

Note however, that because the invention still operates on the shoulder of the response curve, the invention can still be used to operate the YIG resonator device as a signal filter. This can be done by, for example, adjusting the reference to control the electromagnetic coil voltage so as to tune the YIG resonant frequency of the YIG resonator to transfer input signals at desired input frequencies to the output coupling wire. Thus the invention also produces frequency filtered output signals as well.

As previously discussed, in some embodiments, the invention may comprise a YIG resonator (e.g. a YIG sphere 102 in a magnetic field) that is coupled with three loops or coupling wires. In addition to the input loop/coupling wire (504), and the output loop/coupling wire (506), a third "sensing" loop/coupling wire (560) may also be used.

In some embodiments, this third sensing loop/coupling wire (560) can be configured in parallel with the second, output signal loop/coupling wire (506). The third sensing loop/coupling wire (560) can be used as a coupler that operates with almost exactly the same characteristics as that of the second output signal loop/coupling wire (506), with the exception that the third sensing loop/wire is used for feedback control purposes. This third sensing loop/wire (560) takes a portion of the input signal power (510) and brings it to the RF detector (562).

The detector (562) generates a voltage $V_F$ that, because sensing wire (560) is so similar to output wire (506), is thus proportional to the RF power at the filter output (506). This voltage can be compared to a reference voltage, such as a VDAC voltage generated by a digital-to-analog converter (DAC) (564).

Thus in these embodiments, the invention can detect the amount of attenuation by using a third sensing wire (560) that is also magnetically coupled to the YIG resonator (102). This third sensing wire will typically be configured to detect attenuation sensing signals, according to a response curve (402) that is highest when the YIG resonant frequency of the YIG resonator is tuned to an input frequency of said input signals, and the shoulder (406, 408) of this response curve.

The compassion can be performed by a voltage comparator (568), which can be an operational amplifier or other type analog or digital comparison device. The output (570) of the comparator (568) is connected to the magnetic coil driver circuit (572) that controls the electromagnet voltage (thus also current) through the tuning electromagnetic coil (204). This in turn controls the strength of the magnetic field surrounding the YIG sphere (102) (see also FIG. 3, 202, 204, 206, 208), and hence the resonant frequency of the YIG resonator. This driver circuit (572) can comprise a transistor power control circuit, such as a power transistor circuit. Other type driver circuits may also be used.

Put alternatively, here the invention is using a comparator device (568) to compare the amount of attenuation versus a reference. This comparator can operate, for example, by comparing the voltages of a signal representing the amount of attenuation, and the voltage of a reference signal representing the desired amount of attenuation.

Here, as shown in FIG. 5A, the comparator device (568) can be used to implement a closed loop control system. In this embodiment, the comparator device (568) outputs an electromagnetic coil control signal via (570) that varies according to differences between the observed amount of attenuation (e.g. via sensing wire (560) and detector (562)) versus the reference (e.g. delivered by digital to analog converter (564) and optional processor (566). The system and method further can use a driver circuit (572) and this electromagnetic coil control signal (via 570) to control, for example, the (electromagnetic coil voltage controlled) magnetic field produced by electromagnetic coil (204).

More specifically, since the resonant frequency of the YIG resonator sphere (102) is controlled by the strength of the magnetic field (202), the net result is that the output (570) of the comparator (568), via the coil driver (572) and the electromagnetic tuning coil (204), ultimately varies the magnetic field (202), and thus the resonant frequency of the YIG resonator sphere (102).

Consider FIG. 5B and the shape of the filter response curve (580). $V_F$, a voltage measurement of the amount of attenuation (e.g. insertion loss) can be determined by either detecting the output of the third sensing wire (560) using detector (562), or alternatively by sampling the output (550) via a microwave coupling mechanism (not shown) to the output coupling wire (550) and analyzing this sampled output via detector (562).

Such microwave coupling mechanisms can include microstrip line type couplers, and the like. However such microwave coupling mechanisms can have power handling and power loss issues, which can be avoided or at least minimized by the third sensing wire approach.

This alternative technique—detecting the amount of attenuation by using a microwave coupling device to sample output signals from the output coupling wire (506), can either be used in cases where there is no third sensing wire (560). It even can be used when there is a third sensing wire (560). This latter option can be used, for example, to calibrate the output of the third sensing wire (560).

Regardless of how the amount of attenuation is detected, the invention's closed loop feedback mechanism generally operates as follows:

Let us assume that there is not enough attenuation (insertion loss is too low). Then the amount of output RF power (which may be measured by output voltage) (506) at output (550) will be too high, and this can also be detected, for example, by the third sensing wire (560). Let us call this amount of output, under these conditions, $V_{F1}$.

Let us use VDAC to indicate a reference signal, such as a reference voltage, for the desired amount of attenuation (e.g. desired output voltage). VDAC can be generated by various methods, including analog circuitry, or in some embodiments by a digital to analog converter (564) which in turn is adjusted by a computer processor (e.g. microprocessor, microcontroller) (566), to a desired level.

Thus in some embodiments, the reference may comprise a reference voltage (e.g. VDAC) provided by a computer-processor-controlled (566) digital-to-analog converter (565). Such computer processor implemented techniques can be useful for linearizing the feedback mechanism, allowing the user to more precisely control the amount of attenuation or filter response, or other applications.

In any event, if $V_{F1}$>VDAC, then the comparator (568) generates an output signal (570), such as a voltage to the coil driver (572) that changes the voltage/current going through the electromagnetic tuning coil (204) thus altering the strength of the magnetic field (202).

In this example, these changes in the magnetic field (202) have the net result of moving the YIG resonator's resonant curve (e.g. filter response curve 580) to the right, towards higher frequencies, producing an altered filter response curve (590). According to this altered filter response curve, at the same input frequency (582), there is now more insertion loss, and therefore more attenuation.

As can be seen from FIG. 5B, assuming that the input frequency (582) of the input signal (510) remains unchanged, then due to the shift in the filter response curve from (580) to (590), the insertion loss (attenuation) of the YIG filter at input frequency (582) increases. Both the measured output radiofrequency (RF) power (voltage) and the sensed RF output power of the YIG filter increase, producing a new attenuation signal $V_{F2}$ (560) for detector 562. The comparator (568) again compares this with the reference VDAC, and makes further adjustments to the strength of the magnetic field produced by (204) as needed. This process continues until the sensed output RF power (voltage) becomes equal to the desired reference, VDAC.

If $V_F$<VDAC, the resonant frequency moves to the opposite direction till sensed output power and therefore attenuation $V_F$=VDAC, the desired reference amount of attenuation.

Therefore, these components form a closed loop control circuit that keeps the resonant frequency at the point set by the reference signal VDAC, in this example provided by DAC (564). This reference frequency can be either set during initial calibration, or later such as upon instructions from optional processor (566).

Figure 6:
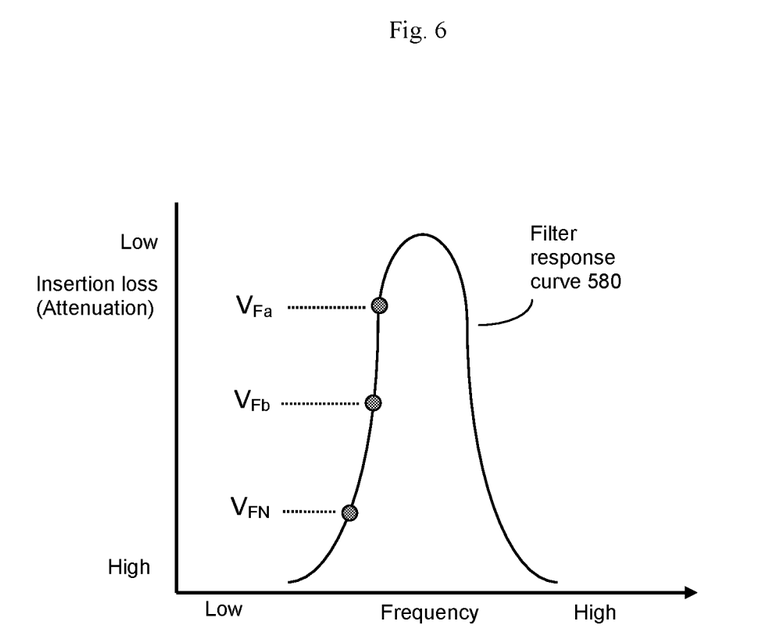
FIG. 6 shows that the invention can be used to set several operating points (e.g. various levels of attenuation), which correspond to different output power levels.

Note that, as shown by FIG. 6, a variety of different attenuation levels (e.g. attenuation points) can be set that correspond to different insertion losses, and therefore different output power levels. For example, the system may be set to various attenuation settings, here represented by various values such as $V_{Fa}, V_{Fb} \ldots V_{FN}$. That is, VDAC can be adjusted so as to adjust the output power levels accordingly.

Note also that in some embodiments, the present invention may be combined with at least one, or a plurality of, other such YIG resonators, YIG filters, YIG oscillators, and the like to produce more complex system. For example, a plurality of units of the present invention may be combined to produce combination bandpass filters/attenuators with wider frequency ranges and/or wide attenuation ranges as desired.

Although in some embodiments, the closed loop control aspects of the present invention may enable the construction of suitable filter/attenuator units without the need for YIG resonator temperature control, in other embodiments, YIG resonator temperature control will still be implemented, and instead the closed loop control aspects of the present invention will be used to produce a higher level of stability than might otherwise be possible with standard temperature control methods alone.

In some embodiments, such as where the input RF signal (510) is already sufficiently filtered or narrow band enough, the invention may be used only for signal attenuation purposes.

Thus, the invention provides an improved combination of YIG filter and attenuator that can operate at different frequencies, different insertion loss levels (e.g. different amounts of attenuation), and also, due to its closed loop control mechanism, can operate with enhanced frequency stability as well. These features can be used to provide an output filtering/amplitude control module for various applications, including microwave signal generators, as a front-end module in spectrum analyzers, and the like.

The invention claimed is:

1. A closed-loop control method of operating a YIG resonator device, said method comprising:
    obtaining a YIG resonator positioned in an electromagnetic coil voltage controlled magnetic field such that a YIG resonant frequency of said YIG resonator is tuned by said electromagnetic coil voltage;
    said YIG resonator being magnetically coupled to both an input coupling wire and an output coupling wire such that said input coupling wire uses said YIG resonator to transfer input signals to said output coupling wire, thus producing output signals, according to a response curve that is highest when said YIG resonant frequency of said YIG resonator is tuned to an input frequency of said input signals;
    operating said YIG resonator in a detuned mode so that said input frequency falls on a shoulder of said response curve, thus producing an attenuated output signal where changes in YIG resonance frequency alter an amount of attenuation of said attenuated output signal;
    detecting said amount of attenuation using a comparator device to compare said amount of attenuation versus a reference, and using differences between said amount of attenuation and said reference to control said electromagnetic coil voltage.

2. The method of claim 1, further used to stabilize a YIG resonant frequency of said YIG resonator when said input frequency is substantially constant by further using differences between said amount of attenuation and reference to control said electromagnetic coil voltage so that said amount of attenuation is controlled with respect to fluctuations in said YIG resonant frequency.

3. The method of claim 1, further used to operate said YIG resonator device as a signal attenuator, further adjusting said reference to control said electromagnetic coil voltage to tune said shoulder of said response curve with respect to said input frequency to produce an attenuated output signal with a desired amount of attenuation.

4. The method of claim 1, further used to operate said YIG resonator device as a signal filter, further adjusting said reference to control said electromagnetic coil voltage to tune said YIG resonant frequency of said YIG resonator to transfer input signals at desired input frequencies to said output coupling wire, thus producing frequency filtered output signals.

5. The method of claim 1, further detecting said amount of attenuation by using a third sensing wire that is also magnetically coupled to said YIG resonator;
    said third sensing wire configured to detect attenuation sensing signals, according to said response curve that is highest when said YIG resonant frequency of said YIG resonator is tuned to an input frequency of said input signals, and said shoulder of said response curve.

6. The method of claim 1, further detecting said amount of attenuation by using a microwave coupling device to sample output signals from said output coupling wire.

7. The method of claim 1, wherein said comparator device outputs an electromagnetic coil control signal that varies according to differences between said amount of attenuation versus said reference, further using a driver circuit and said electromagnetic coil control signal to control said electromagnetic coil voltage controlled magnetic field.

8. The method of claim 1, wherein said reference comprises a reference voltage provided by a computer-processor-controlled digital-to-analog converter.

9. The method of claim 1, further using said YIG resonator device in a system comprising any of other said YIG resonator devices or YIG oscillator devices.

10. A closed-loop controlled YIG resonator device, said device comprising:
    a YIG resonator positioned in an electromagnetic coil voltage controlled magnetic field configured so that a YIG resonant frequency of said YIG resonator is tuned by said electromagnetic coil voltage;
    said YIG resonator magnetically coupled to both an input coupling wire and an output coupling wire such that said input coupling wire, and said YIG resonator, transfer input signals to said output coupling wire, thus producing output signals, according to a response curve that is highest when said YIG resonant frequency of said YIG resonator is tuned to an input frequency of said input signals;
    YIG resonator device further comprising a closed-loop controller configured to operate said YIG resonator in a detuned mode so that said input frequency falls on a shoulder of said response curve, thus producing an attenuated output signal where changes in YIG resonance frequency alter an amount of attenuation of said attenuated output signal;
    said closed-loop controller further configured to detect said amount of attenuation, compare said amount of attenuation versus a reference, and use differences between said amount of attenuation and said reference to control said electromagnetic coil voltage;
    wherein said device further comprises a comparator device; and
    wherein said closed-loop controller is further configured to use said comparator device to compare said amount of attenuation versus a reference.

11. The device of claim 10, wherein said closed-loop controller is further configured to stabilize a YIG resonant frequency of said YIG resonator, when said input frequency is substantially constant, by using differences between said amount of attenuation and said reference to control said electromagnetic coil voltage so that said amount of attenuation is controlled with respect to fluctuations in said YIG resonant frequency.

12. The device of claim 10, wherein said closed-loop controller is further configured to adjust said reference to control said electromagnetic coil voltage to tune said shoulder of said response curve with respect to said input frequency to produce an attenuated output signal with a desired amount of attenuation.

13. The device of claim 10, wherein said closed-loop controller is further configured to adjust said reference and control said electromagnetic coil voltage so as to tune said YIG resonant frequency of said YIG resonator so that it transfers input signals at desired input frequencies to said output coupling wire, thus producing frequency filtered output signals.

14. The device of claim 10, wherein said device further comprises third sensing wire that is also magnetically coupled to said YIG resonator;
said third sensing wire configured to detect attenuation sensing signals, according to said response curve that is highest when said YIG resonant frequency of said YIG resonator is tuned to an input frequency of said input signals and said shoulder of said response curve;
wherein said closed-loop controller is further configured to detect said amount of attenuation by using said third sensing wire.

15. The device of claim 10, wherein said device further comprises a microwave coupling device, wherein said closed-loop controller is further configured to detect said amount of attenuation by using said microwave coupling device to sample output signals from said output coupling wire.

16. The device of claim 10, wherein said comparator device is further configured to output an electromagnetic coil control signal that varies according to differences between said amount of attenuation versus said reference; and
said closed-loop controller is further configured to use a driver circuit and said electromagnetic coil control signal to control said electromagnetic coil voltage controlled magnetic field.

17. The device of claim 10, wherein said reference comprises a reference voltage provided by a computer-processor-controlled digital-to-analog converter.

18. The device of claim 10, wherein said YIG resonator device further comprises part of a system comprising any of other said YIG resonator devices or YIG oscillator devices.

19. A closed-loop control method of operating a YIG resonator device, said method comprising:
obtaining a YIG resonator positioned in an electromagnetic coil voltage controlled magnetic field such that a YIG resonant frequency of said YIG resonator is tuned by said electromagnetic coil voltage;
said YIG resonator being magnetically coupled to both an input coupling wire and an output coupling wire such that said input coupling wire uses said YIG resonator to transfer input signals to said output coupling wire, thus producing output signals, according to a response curve that is highest when said YIG resonant frequency of said YIG resonator is tuned to an input frequency of said input signals;
operating said YIG resonator in a detuned mode so that said input frequency falls on a shoulder of said response curve, thus producing an attenuated output signal where changes in YIG resonance frequency alter an amount of attenuation of said attenuated output signal;
detecting said amount of attenuation, comparing said amount of attenuation versus a reference, and using differences between said amount of attenuation and said reference to control said electromagnetic coil voltage;
wherein said reference comprises a reference voltage provided by a computer-processor-controlled digital-to-analog converter.

* * * * *